United States Patent [19]

Robinson et al.

[11] Patent Number: 4,789,771

[45] Date of Patent: Dec. 6, 1988

[54] METHOD AND APPARATUS FOR SUBSTRATE HEATING IN AN AXIALLY SYMMETRIC EPITAXIAL DEPOSITION APPARATUS

[75] Inventors: McDonald Robinson, Paradise Valley; Ronald D. Behee, Tempe, both of Ariz.; Wiebe B. deBoer, Amersfoort, Netherlands; Wayne L. Johnson, Phoenix, Ariz.

[73] Assignee: Epsilon Limited Partnership, Tempe, Ariz.

[21] Appl. No.: 31,519

[22] Filed: Mar. 27, 1987

Related U.S. Application Data

[62] Division of Ser. No. 784,739, Oct. 7, 1985, Pat. No. 4,654,509.

[51] Int. Cl.⁴ .................... F27B 5/14; F27D 11/02
[52] U.S. Cl. ........................... 219/405; 219/411; 118/730
[58] Field of Search ............. 219/405, 411, 354, 343, 219/342, 347, 349; 118/730, 729, 728, 725, 50.1, 724

[56] References Cited

U.S. PATENT DOCUMENTS

| | | | |
|---|---|---|---|
| 3,836,751 | 9/1974 | Anderson | 219/354 |
| 4,081,313 | 3/1978 | McNeilly | 219/405 |
| 4,101,759 | 7/1978 | Anthony | 219/405 |
| 4,493,977 | 1/1985 | Arai | 219/405 |
| 4,511,788 | 4/1985 | Arai | 219/405 |
| 4,533,820 | 8/1985 | Shimizu | 219/411 |
| 4,540,876 | 9/1985 | McGinty | 219/405 |
| 4,550,245 | 10/1985 | Arai | 219/411 |
| 4,649,261 | 3/1987 | Sheets | 219/405 |
| 4,680,451 | 7/1987 | Gat | 219/411 |

FOREIGN PATENT DOCUMENTS

| | | | |
|---|---|---|---|
| 56-124437 | 9/1981 | Japan | 118/725 |
| 60-189927 | 9/1985 | Japan | 118/730 |

Primary Examiner—E. A. Goldberg
Assistant Examiner—T. Walberg
Attorney, Agent, or Firm—David G. Rosenbaum; Harry M. Weiss

[57] ABSTRACT

An apparatus and method for heating a substrate and associated rotatable susceptor in an epitaxial deposition reactor with an axially symmetric gas flow carrying deposition material include at least one chamber having a plurality of heat lamps. The chamber is generally symmetric with respect to an axis of the substrate. The chamber walls are coated to reflect light from the heat lamps. The outermost heat lamps can be energized to produce a higher temperature than the centrally located lamps to compensate for regions of the reactor which provide access to the substrate and, therefore, promote thermal losses. The spacing of the heat lamps may be varied to compensate for thermal non-uniformity of the heating cavity. The substrate may be rotated, on the rotatable susceptor, to average the thermal environment to which the substrate is exposed.

20 Claims, 2 Drawing Sheets

METHOD AND APPARATUS FOR SUBSTRATE HEATING IN AN AXIALLY SYMMETRIC EPITAXIAL DEPOSITION APPARATUS

This is a divisional of co-pending application Ser. No. 784,739, filed on 10/7/85, now U.S. Pat. No. 4,654,509, issued 1/30/87.

BACKGROUND OF THE INVENTION

1. Field of the Invention

This invention relates generally to epitaxial deposition of materials on a substrate and, more particularly, to epitaxial deposition of materials on a substrate in an axially symmetric configuration. Because of the axially symmetric configuration, the deposition chamber must be specifically designed to provide for uniform heating of substrate.

2. Description of the Related Art

It is known that the quality of the deposited material in an epitaxial deposition chamber can depend, among other things, on the uniformity of the temperature of the substrate and the uniformity of deposition material in the carrier gas. Recently, the advantages of epitaxial deposition in an axially symmetric configuration have been identified. The full advantage of this configuration in a commercial environment can be realized only with rapid, uniform heating of the substrate. In the prior art, massive susceptors have been heated by arrays of linear lamps or by RF fields, with temperature uniformity provided in part by the large thermal mass and high thermal conductivity of a susceptor associated with the substrate. However, the high thermal mass of the susceptor provides a thermal inertia that prolongs the heating and cooling cycles associated with the epitaxial deposition process.

A need has therefore been felt for apparatus and for a method that can rapidly and uniformly heat a wafer and, more particularly, can uniformly heat a susceptor and/or wafer of low thermal mass in an axially symmetric environment.

SUMMARY OF THE INVENTION

It is therefore an object of the present invention to provide an improved apparatus and method for use with epitaxial deposition process.

It is another object of the present invention to provide heating apparatus and method in an epitaxial deposition environment utilizing an axially symmetric gas flow.

It is yet another object of the present invention to provide method and apparatus for uniform heating of a semiconductor substrate in a epitaxial deposition apparatus in which the gas flow and the substrate have axial symmetry.

It is a more particular object of the present invention to provide uniform heating of a semiconductor substate and associated susceptor combination utilizing heating lamps above and below the combination, wherein the two sets of heat lamps are at substantially right angles to each other.

It is yet another object of the present invention to provide a uniform heating of the semiconductor substrate-susceptor combination using a first chamber having a group of heating lamps and a second chamber in which the reflectivity of the chamber on the reverse side of the combination has a predetermined configuration and includes at least two regions with different reflectivity coefficients.

It is still another object of the present invention to provide a substrate-susceptor combination enclosed by two generally square heating chambers.

It is a more particular object of the present invention to enclose a substrate-susceptor combination with two generally square heating chambers, the heating chambers having heat lamps with radiation focused by parabolic reflectors positioned at approximately 90° with respect to heat lamps in the other chamber.

It is another particular object of the present invention to enclose a substrate-susceptor combination with two chambers having radiation from heat lamps focused by parabolic reflectors, the heat lamps in each chamber positioned at approximately 90° to the heat lamps in the other chamber, wherein a plurality of interior heat lamps in at least one chamber have a flat reflecting surface associated therewith.

The aforementioned and other features are accomplished, according to the present invention, by an epitaxial reactor device generally comprised of an upper chamber and a lower chamber substantially enclosing a substrate-susceptor combination. In the upper chamber, a series of heat lamps extend through the interior of the chamber generating at least a portion of the thermal energy for the semiconductor substrate-susceptor combination. The heat lamps are generally parallel and can be equally spaced, and when a circular chamber is used, can have varying portions of the lamps extending through the circular chamber. The reflectivity of the chamber walls is chosen to complement the heat lamps and to provide a uniform distribution of heating radiation within the reactor. According to one embodiment of the invention, a circular lower chamber of the reactor is designed similarly to a circular upper portion. However, the heat lamps in the lower chamber are positioned generally at right angles to the heat lamps of the upper chamber. According to another second embodiment of the present invention, a lower chamber of the reactor comprises a circular chamber in which reflected energy from a circular upper chamber is used to provide thermal energy to the lower portion of the substrate-susceptor combination. A center portion of the lower chamber wall has a reflectivity chosen to provide uniform heating of the substrate-susceptor combination by having reflectivity different from that of the remainder of the chamber. According to yet another embodiment of the present invention, heat lamps in upper and lower chambers have parabolic reflectors associated therewith for providing generally parallel radiation impinging on the substrate-susceptor combination. In this embodiment, the chambers preferably have a square configuration. According to yet another embodiment, at least one of the chambers can have the parabolic reflectors replaced by a flat reflecting surface for selected heat lamps. The walls of the reflectors have deposited thereon a suitable reflecting medium. To provide further the uniformity of heating of the susceptor-substrate combination, the heating lamps can have a higher excitation energy or a smaller inter-lamp spacing, as the distance from the center lamps is increased to compensate, for example, for heat losses through ports necessary, for example, to introduce gas components into the reactor.

These and other features of the present invention will be understood by reading the following description along with the drawings.

DESCRIPTION OF THE PREFERRED EMBODIMENT

Detailed Description of the Figures

Figure 1:
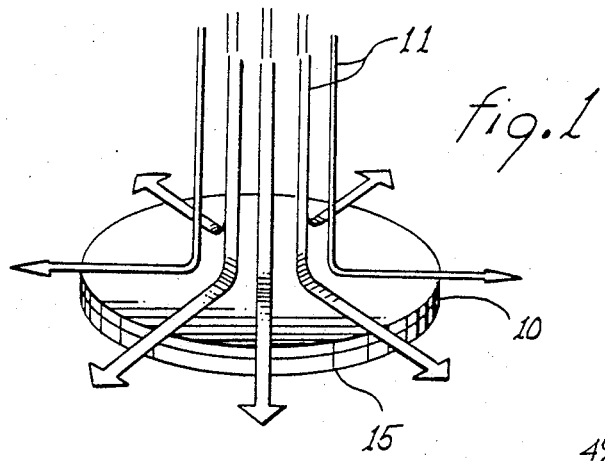
FIG. 1 is a schematic diagram showing the flow of gas toward a substrate to produce an axially symmetric flow.

Referring now to FIG. 1, the general configuration for axially symmetric epitaxial deposition is shown. In the preferred embodiment, the technique consists of projecting a gas carrying the deposition materials with a uniform velocity perpendicular to the substrate 10 and susceptor 15 combination. With apparatus not shown, the gas is conducted from the edge of the circular substrate-susceptor combination, and the result is a configuration for a chemical reaction generally referred to as the stagnation point flow configuration. By stagnation point flow is meant a flow of gas toward a circular substrate that has a uniform temperature and a uniform component of velocity toward the substrate at a predetermined distance.

Figure 2:
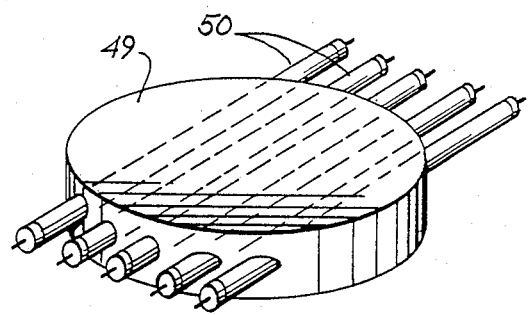
FIG. 2 is a perspective view of one chamber of the reactor having heating lamps passing therethrough.

Referring to FIG. 2, a perspective view of one chamber 49 of a reactor is shown with the heating lamps 50 passing therethrough. In this embodiment, the heating chamber 49 is circular.

Figure 3:
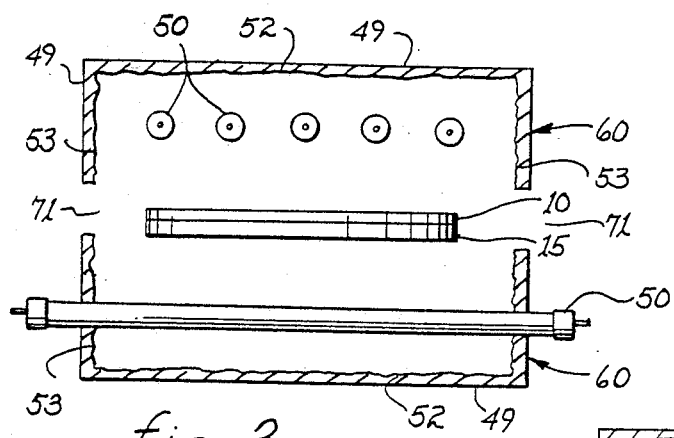
FIG. 3 is a schematic cross-section diagram of a configuration for uniformly heating a substrate-susceptor combination utilizing heat lamps above and below the combination.

Referring next to FIG. 3, the general structure of the reactor for heating the substrate 10 and the associated susceptor 15 is shown. The apparatus shown in this cross-section is not complete. For example, the apparatus for generating the uniform flow of gas toward the substrate is missing as well as structures necessary to support the substrate. However, the essential portions of the apparatus relating to heating of the susceptor 15 and the substrate 10 are shown. The reactor is comprised of two circular chambers 49, one above and one below the substrate-susceptor combination. The purpose of the reactor configuration is to provide an environment that, to the extent possible, provides uniform radiation for the substrate and the associated susceptor. When the radiation is uniform, the temperature of the substrate-susceptor combination will be uniform to the extent that thermal losses are also uniform. The top portion has a circular surface area with a cylindrical side portion. Inserted through the cylinder portion of the chamber 49 are a series of parallel heat lamps 50. The surface of the upper chamber is coated with a diffuse reflecting material, such as a gold plating, and the sides of the chamber are coated with a diffuse or a specular reflecting material. The bottom chamber 49, in this embodiment, is similar to the upper chamber with the exception that the lamps 50 are positioned generally at right angles to the lamps in the upper chamber. The bottom and the side surfaces of the chamber 60 have coatings similar to those described for the upper chamber. Openings 71 between the two chambers, used for introducing gas into the cavity as well as other functions, is important because this region is thermally cool, and tends to produce non-uniform heat losses from the circumference of the substrate.

Figure 4:
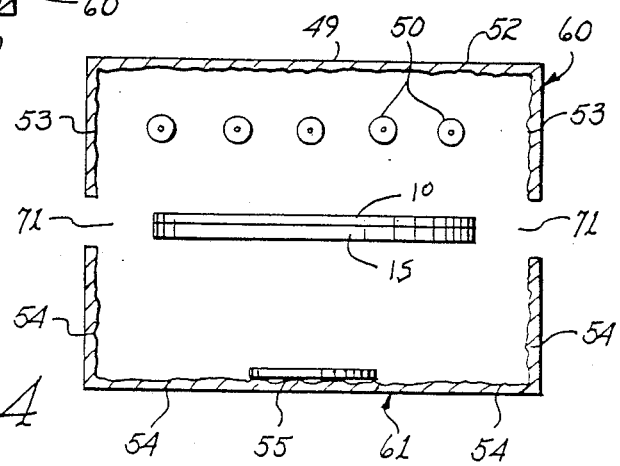
FIG. 4 is a schematic cross-section diagram showing the configuration in which a substrate-susceptor combination is heated by a group of lamps above the combination and is heated by reflected energy from the other side of the combination.

Referring next to FIG. 4, the upper chamber 49 of this embodiment has a similar configuration to the upper chamber shown in the embodiment in FIG. 2. The lamps 50 of the upper chamber are present, the diffuse reflecting material 52 is coated on the upper surface, and the side surfaces can have either a diffuse or a specular reflecting coating 53. Below the upper chamber is a second chamber 61. Chamber 61 has a surface 54 that is coated on the side and a portion of the bottom floor with a diffuse reflector material having, for example, reflectivity of the order of 0.95. In the center of the circular floor portion of the chamber, a circular area 55 has a diffuse reflective coating with a reflectivity lower than that of the other portions, the reflectivity being of the order of 0.8 in the specific configuration described. The lower chamber 61 is used to heat the substrate-susceptor combination using radiation from the upper chamber. Again, aperture 71 is present resulting in a non-uniform radiation field.

Figure 5:
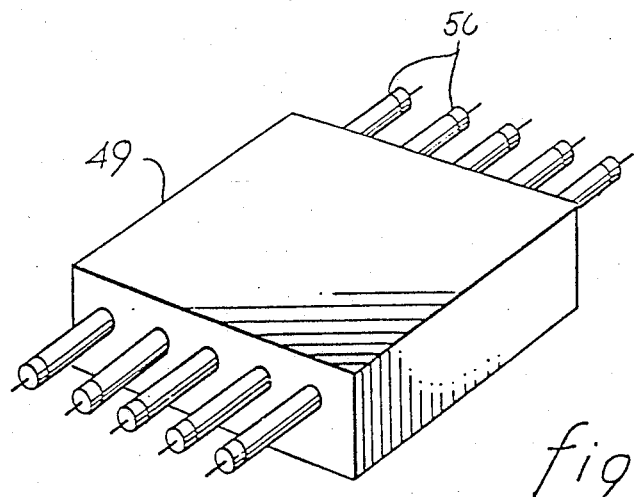
FIG. 5 is a perspective view of a different configuration of a heating chamber with a heating lamp extending therethrough.

Referring next to FIG. 5, a different configuration for for the heating chambers is shown. In this embodiment, the chamber 49 is generally square in nature. Again, heating lamps 50 are inserted therethrough to provide for radiant heating of the substrate-susceptor combination. This configuration has the disadvantage that the symmetry of the substrate-susceptor combination is not present in the chamber configuration. Despite the lack of axial symmetry, it is found that this configuration can result in a uniform substrate-susceptor combination heating.

Figure 6:
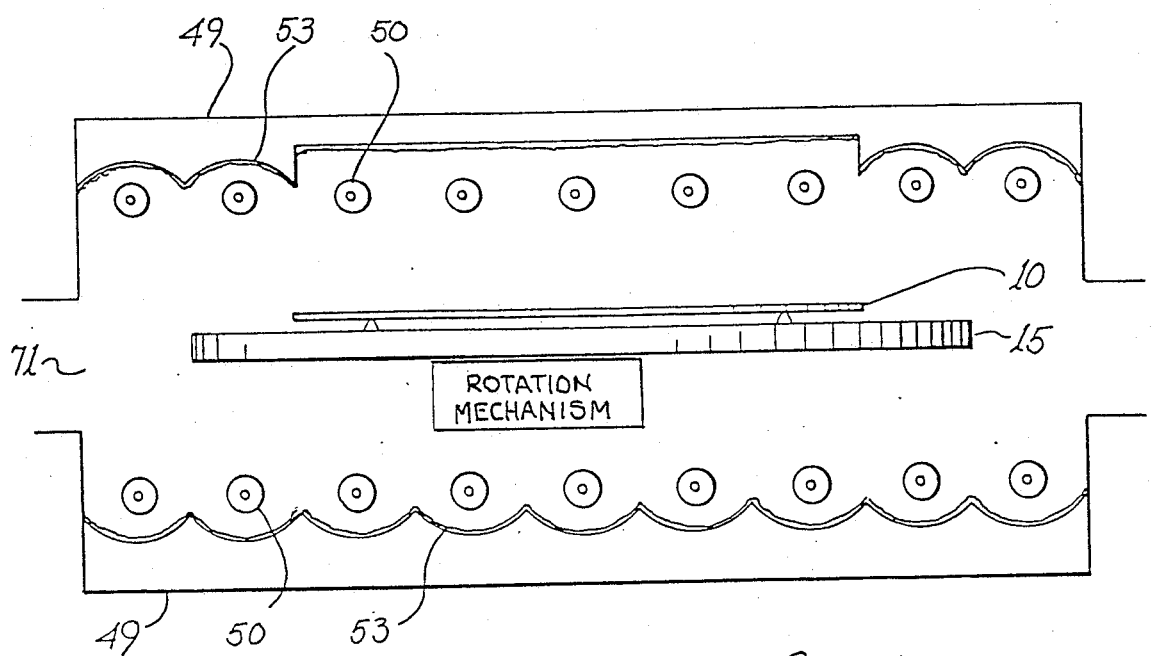
FIG. 6 is a schematic cross-section diagram showing the configuration in which a substrate susceptor combination is heated by a plurality of lamps with associated parabolic and planar reflectors.

Referring to FIG. 6, an embodiment for heating a substrate-susceptor combination that employs the chamber configuration of FIG. 5. In addition, the heating lamps 50 have the emitted radiation reflected by parabolic reflectors 53. In practice, the parabolic reflectors can be approximated by other geometric surface configurations. The parabolic reflector causes the reflected radiation to be parallel thereby increasing the uniformity of the radiation impinging on selected areas the substrate-susceptor combination. As with the configuration shown in FIG. 3, the heating lamps in the lower chamber are generally disposed at right angles to the heating lamps of the upper chamber to average some of the structure imposed on the radiation impinging on the substrate-susceptor combination because of the use of discrete heat sources. Thermal aperture 71 is present as in previous configurations and compromises the uniformity of the radiation field. As shown in the upper chamber, the parabolic reflectors can be replaced by a plane for interior heat lamps of the chamber. In addition, the exterior parabolic reflector of the group of reflectors can be implemented so that the reflectors can be tilted, thereby providing additional control for environment of the substrate-susceptor combination.

Operation of the Preferred Embodiment

The function of the chambers of the epitaxial reactor is to provide, from the perspective of the substrate and associated susceptor, a cavity having uniform radiation field for heating the substrate-susceptor combination. Because of the necessity for introducing and removing the gas with the deposition materials, as well as the necessity for introducing and removing the substrate-susceptor combination itself, the reactor cannot have a truly uniform source of radiation because of requisite apertures for accomplishing the associated functions. The aperture 71 can therefore be critical in any effort to provide a uniform temperature environment for the substrate/susceptor combination because the thermal losses through the aperture cool the combination non-uniformity. However, the regions that do not contain a source of radiation can be made relatively small. The regions that lack a source of radiation are closest to the circumference of the substrate-susceptor combination. In order to correct for this non-uniformity in the radiation field, the end lamps of the array 50 can be operated at elevated power levels producing a higher temperature, and therefore higher radiation intensity, than the other heating lamps. This additional heating can compensate for the otherwise lower radiation intensity at the circumference of the substrate. To further provide axially uniform radiation, the heat lamps in the bottom chamber are placed at a large angle, approximately 90°, with respect to the lamps in the upper chamber. In addition, to provide more uniform thermal environment, a diffuse reflector is deposited on the various portions of the chamber other than the parabolic reflectors to simulate as nearly as possible a constant temperature region as viewed from any region of the substrate. In addition, by apparatus not shown, the substrate-susceptor combination can be rotated to further average any departures from the observance of a uniform temperature environment for the substrate-susceptor combination.

Referring once again to FIG. 4, only the upper chamber is provided with a heat generating lamp configuration. In this embodiment, the lower chamber does not produce power directly, but reflects power from the upper heating chamber. It has been found by computer simulation that, in order to achieve a uniform temperature in this configuration, it is necessary to have a region 55 with an intermediate magnitude reflectivity. Region 55 causes the center of the substrate-susceptor combination to receive a lower intensity of reflected radiation compared with the circumference, thus compensating for the nonuniform radiation discussed previously. As indicated above, the areas 54 include a diffuse reflector with a reflectivity on the order of 0.95, while the area 55 includes a diffuse reflector with a reflectivity of about 0.8. The diameter of area 55 is approximately two-thirds the diameter of the susceptor-substrate combination. However, this relationship is a function of size of the substrate, distance between the substrate and the reflecting surface, and the other structural dimensions.

It will be clear that additional thermal energy in the exterior regions of the chamber can be achieved by a higher density of lamps at the external region. In addition, the dimension of the chamber can be expanded so that the aperture 71 has a smaller influence on the non-uniform field experienced by the substrate/susceptor combination. The use of square heating chambers provides a situation where the corners of the heating chamber provide a larger effective chamber and can minimize the influence of aperture 71.

It will be clear to those skilled in the art that various gases interacting with the substrate must generally be confined while flowing in the vicinity of the substrate. The confinement can be performed by materials such as quartz, that permit a large portion of the radiation to be transmitted therethrough. However, the properties of the quartz or other enclosing material, such as the absorption or emission characteristic, must be considered in determining the thermal environment of the substrate/susceptor combination.

The above description is included to illustrate to operation of the preferred embodiment and is not meant to limit the scope of the invention. The scope of the invention is to be limited only by the following claims. From the above description, many variations will be apparent to those skilled in the art that would yet be encompassed by the spirit and scope of the invention.

What is claimed is:

1. An apparatus for heating a substantially circular substrate, comprising:
   a chamber positioned generally along an axis of a substrate and substantially on one side of said substrate;
   a plurality of heating lamps extending through said chamber;
   a coating for reflecting radiation from said heating lamps into said chamber;
   a single-substrate susceptor disposed within said chamber and supporting the substantially circular substrate; and
   rotation means for rotating said single-substrate susceptor and the substantially circular substrate about their central axis.

2. The apparatus for heating a circular substrate of claim 1 further including a second chamber on a second side of said substrate, wherein lamps in said second chamber are located at approximately 90° angles from the first chamber lamps.

3. The apparatus for heating a circular substrate of claim 2 further including a parabolic reflector associated with each of a plurality of said lamps.

4. The apparatus for heating a circular substrate of claim 2 in which selected heating lamps have parabolic reflectors associated therewith.

5. The apparatus for heating a circular substrate of claim 2 wherein said chambers are generally square.

6. The apparatus for heating a circular substrate of claim 1 further including a second chamber located on a second side of said substrate along an axis of said semiconductor substrate, said chamber having a high reflectivity coating, said chamber further including a coating region having a lower reflectivity symmetrically disposed about the axis of the substrate.

7. The apparatus for heating a circular substrate of claim 2 wherein power supplied to said lamps is a function of lamp position.

8. The method of uniformly heating a substantially circular substrate, comprising the steps of:
   positioning a chamber on either side of said substrate;
   extending heat lamps through walls of said chamber in at least one chamber;
   rotating said substrate about its central axis; and
   adjusting energy applied to said heat lamps to provide a uniform heating of said substrate.

9. The method of heating a circular substrate of claim 8 further comprising the step of:
  adjusting reflectivity of walls of a second chamber wherein a symmetrical portion of said reflectivity has a different value of reflectivity than a remainder of said second chamber walls.

10. The method of heating a circular substrate of claim 8 wherein said first and said second chambers have heat lamps extending therethrough, said method further including the step of positioning said second chamber until said heat lamps of said second chamber are approximately at right angles to said heat lamps of said first chamber.

11. The method of heating a circular substrate of claim 8 further including the step of rotating said substrate.

12. Apparatus for heating a circular substrate in an epitaxial reactor comprising:
  a first chamber symmetrically disposed along an axis on one side of said substrate;
  a second chamber symmetrically disposed along an axis on a second side of said substrate;
  rotation means for rotating said circular substrate about its central axis; and
  a plurality of radiation means disposed through said first chamber, said radiation means positioned and energized to provide a uniform temperature across said substrate.

13. The apparatus for heating a circular substrate in an epitaxial reactor of claim 12 further including a reflective coating on an interior of said second chamber, said coating having an axially symmetric region with a coating having a lower value of reflectivity than a remainder of said coating.

14. The apparatus for heating a circular substrate of claim 12 wherein said second chamber includes a plurality of second radiation means disposed throughout said first chamber, said second radiation means positioned and energized to provide a uniform temperature distributor-through said region formed by said first and said second chamber.

15. The apparatus for heating a circular substrate of claim 14 wherein each of a plurality of said radiation means includes a source of radiation associated with a parabolic reflector.

16. Apparatus for heating a substantially circular substrate, comprising;
  a first chamber disposed on one side of a substantially circular substrate, said first chamber having walls coated with a material having a high coefficient of reflectivity;
  a second chamber disposed on a second side of said circular substrate, said second chamber having walls coated with a material having a high coefficient of reflectivity wherein said first and said second chambers form a cavity for said circular substrate;
  rotation means for rotating said substantially circular substrate about its central axis; and
  heating means for uniformly heating said substrate in said cavity.

17. The apparatus for heating a circular substrate of claim 16 wherein said heating means includes a first plurality of heating lamps disposed through said first chamber and a plurality of heating lamps disposed through said second chamber, said first chamber lamps positioned at roughly 90° to said second chamber lamps.

18. The apparatus for heating a circular substrate of claim 17 further including a parabolic reflector associated with each of a plurality of said heating lamps.

19. The apparatus of claim 17 wherein said heating means includes, for achieving a more uniform temperature, at least a one of:
  disposing said lamps in said chamber in a preselected spatial relationship relative to one another; or
  varying excitation energy applied to said lamps.

20. The apparatus of claim 16 wherein said heating means includes a plurality of lamps disposed in said first chamber, and a generally axially symmetric region having a reflectivity value lower than a remainder of said reflectivity in said second chamber.

* * * * *